United States Patent [19]

DuPoy

[11] Patent Number: 4,688,236

[45] Date of Patent: Aug. 18, 1987

[54] PROCESS FOR THE USE OF A BINARY REGISTER WITH N BISTABLE CELLS MAKING IT POSSIBLE TO DETERMINE THE RATIO OF TWO FREQUENCIES AND APPARATUS FOR PERFORMING THE PROCESS

[75] Inventor: Marc DuPoy, Paris, France

[73] Assignee: Commissariat a l'Energie Atomique, Paris, France

[21] Appl. No.: 877,847

[22] Filed: Jun. 24, 1986

[30] Foreign Application Priority Data

Jul. 3, 1985 [FR] France ................................ 85 10173

[51] Int. Cl.⁴ ..................... H03K 21/18; H03K 21/00
[52] U.S. Cl. ........................................ 377/48; 377/75;
377/112; 377/64; 377/49; 328/133; 328/161;
307/525
[58] Field of Search ....................... 377/75, 70, 47, 48,
377/49, 39; 328/133, 158, 161; 307/525, 490,
498; 324/79 D

[56] References Cited

U.S. PATENT DOCUMENTS

| | | | |
|---|---|---|---|
| 3,539,920 | 11/1970 | Boltz, Jr. ............................ | 307/525 |
| 3,859,512 | 1/1975 | Ritzinger ............................. | 377/49 |
| 3,971,994 | 7/1976 | Shepherd ............................ | 328/133 |

FOREIGN PATENT DOCUMENTS

| | | | |
|---|---|---|---|
| 1293341 | 4/1969 | Fed. Rep. of Germany ...... | 307/525 |
| 1343995 | of 1963 | France . | |

*Primary Examiner*—John S. Heyman
*Assistant Examiner*—Karl Ohralik

[57] ABSTRACT

The invention relates to a process for using a binary register with n bistable cells making it possible to determine the ratio of two frequencies and an apparatus for performing the process. This use process consists of supplying to a counting input of the binary register with n bistable cells a first pulse signal $S_1$ of frequency $F_1$ and to a shift input of said register a second pulse signal $S_2$ of frequency $F_2$ with $F_1 \gg F_2$, the register content being incremented at each pulse of the first signal $S_1$ and divided by two at each pulse of the second signal $S_2$, whereby the register content can also be loaded into a buffer register at each pulse of the second signal $S_2$. The invention more particularly applies frequency discrimination, the determination of an unknown frequency on the basis of a known frequency and to the control of analog display means of the logarithm to base two of the ratio of two frequencies.

11 Claims, 4 Drawing Figures

PROCESS FOR THE USE OF A BINARY REGISTER WITH N BISTABLE CELLS MAKING IT POSSIBLE TO DETERMINE THE RATIO OF TWO FREQUENCIES AND APPARATUS FOR PERFORMING THE PROCESS

BACKGROUND OF THE INVENTION

The present invention relates to a process for the use of a binary register with n bistable cells making it possible to determine the ratio of two frequencies and to an apparatus for performing this process.

The invention more particularly applies to the determination of the ratio of two frequencies of periodic or random signals, as in the case of nuclear incidents.

A binary register with n bistable cells used in the process according to the invention is known. Such a register is e.g. marketed under reference 74197 by Cordura Company, San Diego, Calif. This type of register generally functions either as a binary counter, or as a shift register.

A binary register with n bistable cells comprises n interconnected bistables. Each bistable $B_i$, with i being an integer such that $1 < i < n$ has two stable states, namely an activated state represented by bit 1 and a non-activated state represented by bit 0. The state of a bistable is dependent on the input signals applied thereto. Thus, when activated a bistable $B_i$ represents the number $2^{(i-1)}$ in decimal notation. Any integer can be written in the form of a sum of integral powers of 2. The multiplicative coefficients of these powers of 2 represent by juxtaposition said integer in binary notation. The state of the different bistables of a binary register consequently represents the content of the register in binary notation. Thus, when the bistables $B_5$ and $B_3$ of a binary register with five bistables are activated, the other bistables being at state 0, the content of the register in binary notation is equal to 10100, i.e. in decimal notation to:

$$1 \times 2^4 + 0 \times 2^3 + 1 \times 2^2 + 0 \times 2^1 + 0 \times 2^0 = 20$$

Thus, when operating as a binary counter, an input signal $S_1$ in the form of a pulse train is supplied to a counting input of a binary register with n bistables from the first bistable $B_1$ forming the same. The register content is incremented by one unit for each pulse of the signal $S_1$. Thus, when the input bistable $B_1$ is at state 0, it is activated by a pulse of signal $S_1$ and passes to state 1. Conversely, when the bistable $B_1$ is at state 1, it passes to state 0 and increments the following bistable $B_2$. Bistable $B_2$ passes to state 1 if its preceding state was 0 or passes to state 0 if its preceding state was 1 by incrementing bistable $B_3$ and so on.

Thus, it is possible to deduce from the state of n bistables, the content of the register, i.e. the number of pulses received at the input of the register in binary notation, the bistable $B_1$ representing the lowest order bistable and bistable $B_n$ the highest order bistable.

A binary register with n bistable cells can obviously function as a subtract counter by decreasing the content of the register by one unit for each pulse of signal $S_1$.

When operating as a shift register, an input signal $S_2$ in the form of a pulse train is supplied to a shift input of the register with n bistables. This signal $S_2$ is simultaneously applied to all the bistables. The content of the register is shifted by one bistable for each pulse of signal $S_2$ from bistable $B_n$ to bistable $B_1$ with the introduction of a state 0 into bistable $B_n$, which amounts to the division by two of the register content. If, for each pulse of signal $S_2$, the register content is shifted by one bistable from bistable $B_1$ to bistable $B_n$ with the introduction of a state 0 into bistable $B_1$, this amounts to multiplying the register content by two. The same can take place by working on the content of the register in complement of two and by introducing a state 1 in the place of a state 0.

SUMMARY OF THE INVENTION

The present invention relates to a process for the use of a binary register with n bistable cells in such a way that it simultaneously functions as a binary counter and as a shift register.

More specifically, the present invention relates to a process for the use of a binary register with n interconnected bistable cells, wherein a first pulse signal $S_1$ of frequency $F_1$ is supplied to a counting input and a second pulse signal $S_2$ of frequency $F_2$ is supplied to a shift input, with $F_1 \gg_2$, the register content being permanently incremented by one unit for each pulse of the first signal $S_1$ and shifted so as to divide by two the said content for each pulse of the second signal $S_2$, the register content representing the ratio of the two frequencies.

According to a method of using the bistable register with n bistable cells, the content of said register is loaded into a buffer register with n cells connected to said binary register with n bistable cells for each pulse of the second signal $S_2$.

According to an embodiment of the binary register with n bistable cells, an unknown frequency is measured by supplying to the input of said register a reference frequency signal and the unknown frequency signal, the register content making it possible to determine the unknown frequency from the reference frequency.

According to another embodiment of the binary register with n bistable cells, the logarithm to base two of the contents of said register is displayed by means of display devices connected to said register, each activated bistable $B_i$ representing the number $2^{(i-1)}$ in decimal totation, with i being an integer such that $1 \leq i \leq n$.

According to another method of using the binary register with n bistable cells for the detection of the passage of said ratio to a given value, the detection pulse corresponds to the activation of the bistable cell materializing said value.

The invention also relates to an apparatus for performing the use process comprising a binary register with n bistable cells and display means for displaying the logarithm to base two of the register content, said means being connected on the one hand to the outputs of the binary register with n bistable cells and on the other to a voltage level common to all said means, each display means comprising a logic OR gate connected at the output to a display cell, the output of one logic OR gate of a display means also being connected to the input of the logic or gate of the lower order display means.

According to an embodiment of the apparatus, the display cell is a photoemissive diode.

According to a constructional variant of the apparatus, the display cell is a liquid crystal cell.

According to an embodiment of the apparatus, each display means is connected to a single bistable cell.

According to another constructional variant of the apparatus, the display cells are replaced by a current or voltage generator connected to a device for the analog representation of a value proportional to the logarithm of the register content via a summing circuit.

According to a constructional variant, the display means also comprises $2^p - 1$ intermediate display means making it possible to have an accuracy of $1/(2^p)$ on the display, said intermediate display means being positioned between a display means associated with a bistable cell $B_i$ and a display means associated with a bistable cell $B_{i+1}$, with i and p being integers such that $1 \leq i \leq n$ and $p \geq 1$, the intermediate display means controlled by logic devices forming sums of the contents of the bistable cells $b_i, B_{i-1}, \ldots B_{i-p}$. For example, p intermediate display means are respectively connected via a logic AND gate on the one hand to one of the p bistable cells $B_{i-1} \ldots B_{i-p}$ of lower order than the bistable cell $B_i$ and on the other hand to the bistable cell $B_i$ and the remaining intermediate display means are respectively connected via a logic AND gate to the output of the logic AND gates of two of the intermediate display means.

According to an embodiment of the apparatus, it also comprises a buffer register with n cells, each cell being connected to the output of a single bistable cell.

BRIEF DESCRIPTION OF THE DRAWINGS

The invention is described in greater detail hereinafter relative to non-limitative embodiments and with reference to the attached drawings, wherein show:

FIG. 2b, diagrammatically an example of the application making it possible to improve the accuracy of the display of the application example of FIG. 2a.

DETAILED DESCRIPTION OF THE INVENTION

Figure 1A:
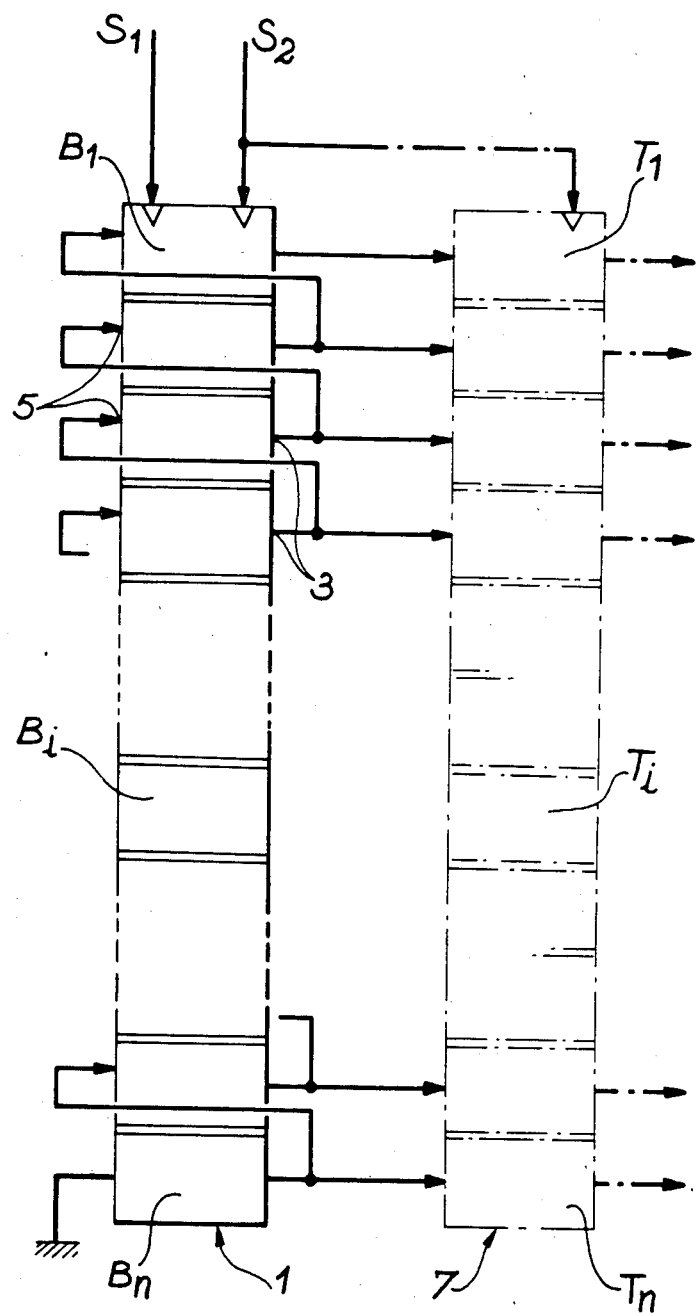
FIG. 1a, diagrammatically a register with n bistable cells used according to the process of the invention.

FIG. 1a diagrammatically shows a binary register 1 with n bistable cells used according to the process of the invention. The n bistable cells or bistables forming said register are interconnected, the output 3 of each bistable $B_i$ being connected to input 5 of bistable $B_{i-1}$, with i being an integer such that $1 \leq i \leq n$. The bistable $B_1$ of rank or order 1 represents the lowest order bistable and when activated it corresponds to the integer $2^0$ and the bistable $B_n$ of rank or order n represents the highest order bistable which, when activated, corresponds to the integer $2^{n-1}$.

Two signals $S_1$ and $S_2$ in the form of periodic or random pulse trains of respective frequencies $F_1$ and $F_2$, with $F_1 >> F_2$ are applied to the input of bistable $B_1$ of the binary register 1. The signal $S_1$ corresponding to the frequency $F_1$ is supplied to a counting input of binary register 1 and signal $S_2$ of frequency $F_2$ is supplied to a shift input of said register 1.

The content of binary register 1, represented by the state of the different bistables thereof is incremented permanently for each pulse of signal $S_1$ of frequency $F_1$ and divided by two when register 1 receives a pulse of signal $S_2$ of frequency $F_2$. As indicated hereinbefore, the division by two takes place by a shift of the register content by one bistable from the highest order bistable $B_n$ to the lowest order bistable $B_1$, the highest order bistable $B_n$ being brought to state 0.

When taking as the time origin $t=0$ corresponding to the putting into operation of register 1 at $t=1/F_2$, $1/F_2$ corresponding to the period of signal $S_2$, register 1 has received $F_1/F_2$ pulses of signal $S_1$ of frequency $F_1$ and one pulse of signal $S_2$ of frequency $F_2$. The register content is then divided by two and is equal to $F_1/(2.f_2)$. In the same way, at $t=2/F_2$, the register content is equal to $F_1/(2.F_2) + F_1/(4.F_2)$, etc. The content N of the register at $t=k/F_2$ is consequently given by the following relation:

$$N = F_1/F_2 \cdot (1/2^1 + \ldots 1/2^k)$$

The bracketed quantity is approximately equal to $1 = (1/2^k)$ tending towards 1 when k increases indefinitely. Thus, following each pulse of signal $S_1$, the register content N tends towards a limit value equal to $F_1/F_2$ representing the ratio of the two frequencies of the input signals $S_1$ and $S_2$. Between $t = k/F_2$ and $t = (k + 1/F_2) - \epsilon$, with $\epsilon << 1/F_2$, the register contents consequently oscillates between values N and 2N, i.e. between $F_1/F_2$ and $2.F_1/F_2$.

As any positive number can be expressed in the form of a power x of two, x being generally a non-integer, the register content is equal to $2^x$ with $0 \leq x \leq n-1$, x representing the logarithm to base two of the register content. The order i of the activated highest order bistable $B_i$ consequently represents by excess the logarithm to base two of the number contained in register 1.

On the basis of the register with n bistable cells used according to the process of the invention, a number of different applications are possible. The main application is the measurement of an unknown frequency $F_i$ from a reference frequency $F_r$, the content of the register before or after division (N or 2N) representing the ratio of these two frequencies.

The reference frequency $F_r$ can be both $F_1$ and $F_2$. However, if it is wished to obtain a response time inversely proportional to the unknown frequency $F_1$, $F_2$ is taken as the unknown frequency. The signal of frequency $F_r$ can in particular be a clock signal or the sign of an adjustable oscillator.

In the case where the frequency signal $F_1$ is random, as in the case of nuclear incidents, the frequency $F_i$ is previously divided by a binary counter, which permits a smoothing and consequently avoids frequency fluctuations. However, when the level of the signal of frequency $F_i$ varies slowly or not at all, said dividing circuit is optional.

Thus, if a signal of known fixed frequency $F_2$ is supplied to a shift input of register 1 and a signal of unknown frequency $F_1$ to a counting input thereof, it is possible to deduce the unknown frequency $F_1$ from the content of the register representing the ratio $F_1/F_2$. Thus, on introducing a signal of frequency $F_1$ representing nuclear events and a signal of frequency $F_2$ equal to 1 Hz, the content N of the register represent the counting rate expressed in counts per second.

It is also possible to use the binary register with n bistable cells according to the invention as a frequency discriminator making it possible to compare an unknown frequency with a chosen threshold frequency.

An unknown frequency $F_1$ or $F_2$ is defined with respect to a threshold frequency and by introducing a reference frequency $F_2$ or $F_1$ by the relation $F_1/2^{i-1} \geq F_2$. This relation is established when the bistable of order i is activated following the division of the register content or when the bistable of order i+1 is activated prior to division, the relation $F_1/2^{i-1} < F_2$ being established when the bistable of order i is at state 0 following division or when the bistable of order i+1 is at state 0 before division. Thus, the pulse passing through the threshold frequency is produced by the activation of the order i bistable when reading takes place following division or the order i+1 bistable when reading takes place before division. The threshold frequency is preferably materialized by the highest order bistable, the activation thereof producing the threshold passage pulse.

Thus, on supplying a register according to the invention with a signal of fixed frequency $F_2$ and a signal of unknown frequency $F_1$, if the bistable materializing the frequency threshold chosen is at state 0, frequency $F_1$ is below the threshold frequency, whereas if it is at state 1, frequency $F_1$ is equal to or higher than the chosen threshold frequency. In this particular case, the binary register with n bistables is used as a frequency discriminator.

It has already been shown that the order corresponding to the final activated bistable represents the logarithm to base two by excess of the register content, the accuracy of said logarithm being improvable by taking account of the activated lower order bistables. Thus, it is possible to obtain an analog display of the content of a binary register with n bistables by associating display means therewith. This application example will be described in greater detail relative to FIGS. 2a and 2b.

To avoid fluctuations in the content of binary register 1 with n bistables during each pulse of the signals $S_1$ and $S_2$ of frequencies $F_1$ and $F_2$, it is possible to associate with register 1 a buffer register 7, which loads the content of the register 1 for each pulse of signal $S_2$ of frequency $F_2$. Buffer register 7 comprises n cells, each cell $T_i$ being connected to the output of a bistable $B_i$, with i being an integer such that $1 \leq i \leq n$. The signal $S_2$ of frequency $F_2$ is also supplied to the input of the buffer register, so that for each pulse of signal $S_2$ the content of each bistable $B_i$, before or after division, is loaded into the cell $T_i$ of the corresponding buffer register.

Figure 1B:
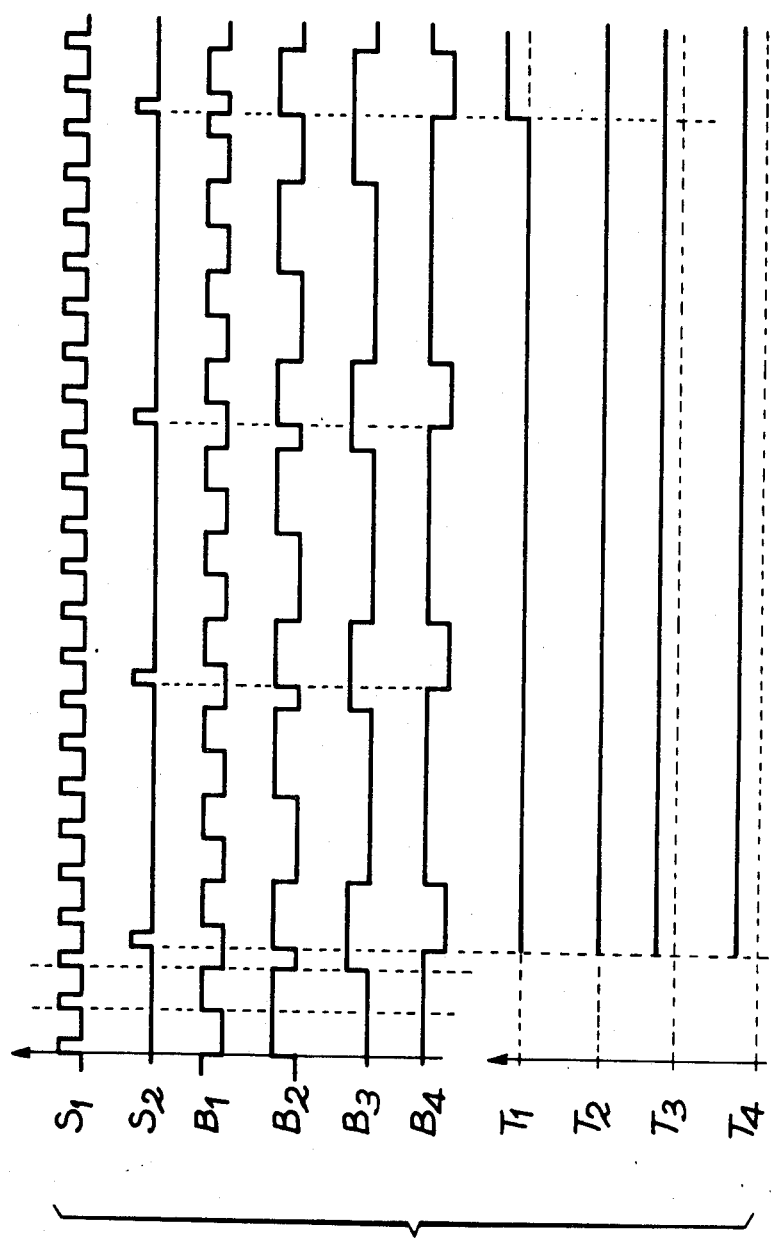
FIG. 1b, an exemplified timing chart of input signals applied to a register with four bistables used according to the process of the invention, as well as the resulting state of these bistables transferred to a buffer register.

FIG. 1b is a timing chart of examples of signals applied to the input of a binary register with four bistables according to the invention with the different states resulting from these bistables. This timing chart provides a better understanding of the operation of a register 1 used according to the inventive process, as well as the operation of a buffer register 7 optionally associated therewith.

Signal $S_1$ corresponding to frequency $F_1$ is supplied to a counting input of register 1 and signal $S_2$ of frequency $F_2$ is supplied to a shift input of a register 1, with $F_1 >> F_2$. The states of the four bistable cells $B_1$, $B_2$, $B_3$, $B_4$ of the register are represented in order from the lowest order bistable $B_1$ corresponding to $2^0$ to the highest order bistable $B_4$ corresponding to $2^3$.

Prior to the first pulse of signal $S_1$, the content of the register in binary notation represented by the activated or non-activated levels of the four bistables of the register is 1001. The first pulse of signal $S_1$ will increment the register content by one unit, so that the new content is then 1010. At the second pulse of signal $S_1$, the register content assumes the value 1011 and so on until a pulse of signal $S_2$ is applied to the input of register 1. Before the first pulse of signal $S_2$, the content of the register is 1100. The pulse of signal $F_2$ will bring about a shift of the register content by one bistable, from the highest order bistable $B_4$ to the lowest order bistable $B_1$ with a deactivation of the highest order bistable $B_4$. The register content is then equal to 0110, which is equivalent to a division by two. Thus, these operations are successively repeated, the register content consequently fluctuating between value N and 2N between each shift.

To prevent these fluctuations, it is possible to associate with a register having n bistables operating according to the invention a conventional buffer register into which is loaded the content of the register before or after shifting whenever a pulse of signal $S_2$ appears.

In the case of a register with four bistables $B_1$, $B_2$, $B_3$, $B_4$, with it is associated a buffer register having four cells, $T_1$, $T_2$, $T_3$, $T_4$, each cell $T_i$ being connected to the output of bistable $B_i$, with i being an integer such that $1 \leq i \leq 4$ for this example.

The different states of the four buffer cells $T_1$, $T_2$, $T_3$, $T_4$ respectively associated with the four bistables $B_1$, $B_2$, $B_3$, $B_4$ are also represented in FIG. 1b.

It can be seen that for each pulse of signal $S_2$, the content of each bistable $B_i$ is loaded into the corresponding cell $T_i$ before shifting. Thus, on the first pulse of signal $S_2$, the content of the register with four bistables in binary notation is 1100. This number is then loaded into the associated buffer register, cells $T_4$, $T_3$, $T_2$, $T_1$ then being respectively in states 1100 and this applies to each pulse of signal $S_2$.

In this example, the frequencies $F_1$ and $F_2$ are firstly constant, so that the register content does not vary. Then, as the frequency $F_2$ between the last two represented pulses of signal $S_2$ is lower, at the final pulse of signal $S_2$, the register content is higher (1101) than at the preceding pulses of signal $S_2$ (1100). Thus, the buffer register loads the new value 1101.

Figure 2A:
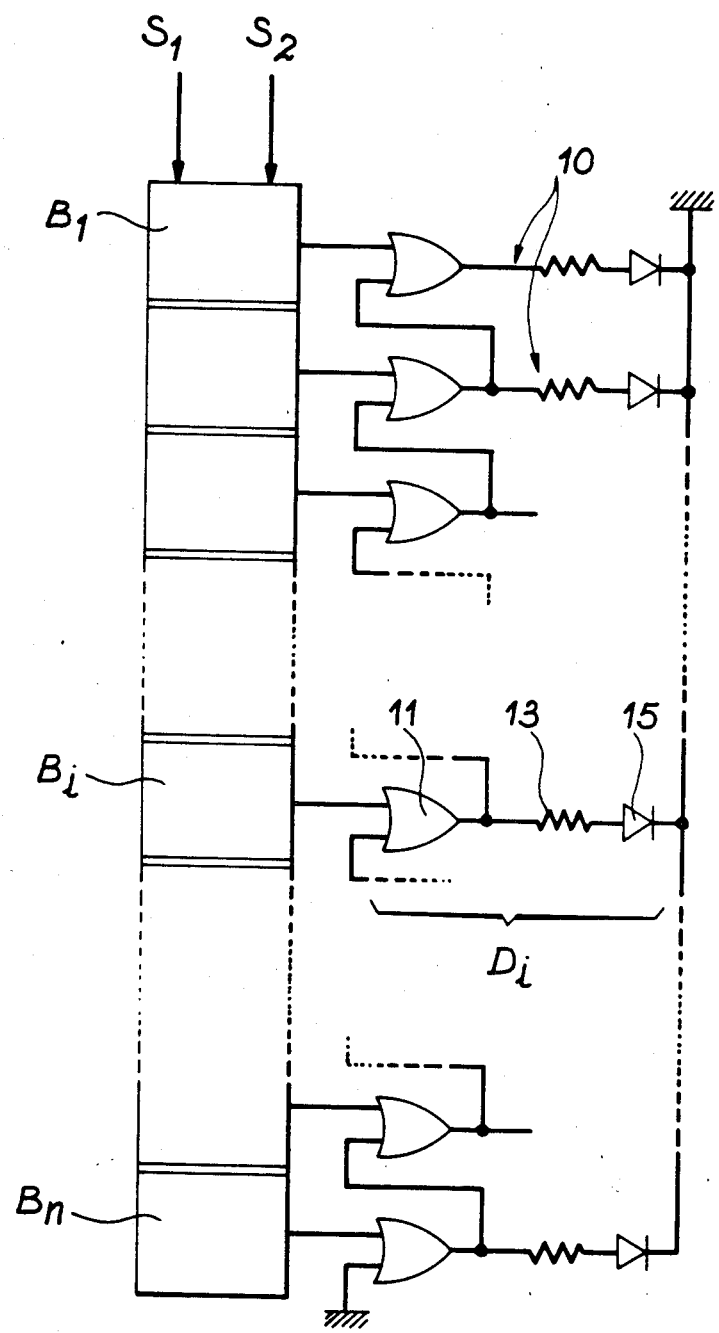
FIG. 2a, diagrammatically an example of the application of the binary register with n bistable cells used according to the inventive process permitting the display of the logarithm to base two of the content of said register.

FIG. 2a shows a binary register 1 with n bistables ($B_1$, $B_2$ . . . $B_3$) used according to the invention associated with display means 10 making it possible to produce an analog signal proportional to the logarithm of the register content. Each bistable $B_i$ is connected to a display means $D_i$, with i being an integer such that $1 \leq i \leq n$.

A display means $D_i$ comprises a logic OR gate 11 connected to the output of bistable $B_i$ and to the output of the logic OR gate connected to the bistable $B_{i+1}$. Each logic OR gate 11 is connected to the output of a display cell 15, generally by a load resistor 13. The display cell is in particular a liquid crystal cell or a photoemissive diode, as in the example of the drawing.

On the the basis of these display means, it is possible to produce a voltage or current generator of value proportional to the logarithm of the content of register 1, by eliminating display cells 15 and by connecting the load resistors 13 to the input of an operational amplifier with a resistive feedback chain, thus obtaining a summing circuit.

For an analog light display of the logarithm of the register content and as a function of the origin of the desired display, the common point of all the display cells, assembled in ramp form, is connected either to the positive supply voltage level, or to the negative supply voltage level (common cathodes or common anodes).

In the case where the common voltage level is positive, the origin of the display corresponds to the display means $D_n$ associated with the highest order bistable $B_n$.

When the common voltage level is negative or corresponds to earth, as in the case of the example of the drawing, the origin of the display corresponds to the display means $D_1$ associated with the lowest order bistable $B_1$.

The drawing shows the lowest order bistable $B_1$ at the top, so that the display origin is also at the top. It would also have been possible to connect register 1 and the display means in the opposite way to have the lowest order bistable $B_1$ and the display origin at the bottom of the drawing.

In the case of such an arrangement and by means of the logic OR gates which are interconnected, the activated highest order bistable not only switches on the display cell 15 associated therewith, but also all the display cells associated with the lower order bistables.

Thus, if the register content is equal to 10110, the activated highest order bistable $B_5$ will control the display of all the display cells associated with bistables $B_4$, $B_3$, $B_2$, $B_1$, no matter what their state. Conversely, the display cells associated with bistables $B_6$, $B_7$, ... $B_n$ will remain switched off.

The rank of the highest order activated bistable represents the logarithm to base two by excess of the register content. In the example in question, the order of bistable $B_5$ corresponds to the whole number five, which thus represents the logarithm to base two by excess of the binary number 10110 and equals 4.4594.

Due to fluctuations in the register content, between the display means and the register 1 with n bistables, it is possible to insert a buffer register 7. The latter is then used in the same way as described relative to FIG. 1a, each cell $T_i$ of buffer register 7 also being connected at the output to the input of a logic OR gate 11 of the corresponding display means $D_i$.

The display means 10 described hereinbefore make it possible to display in analog manner to the logarithm to base two of the register content by excess or deficiency, e.g. on shifting the display origin by one bistable. In order to increase the accuracy of the display, it is necessary to take account of the state of the bistables of order lower than the activated highest order bistable.

Figure 2B:
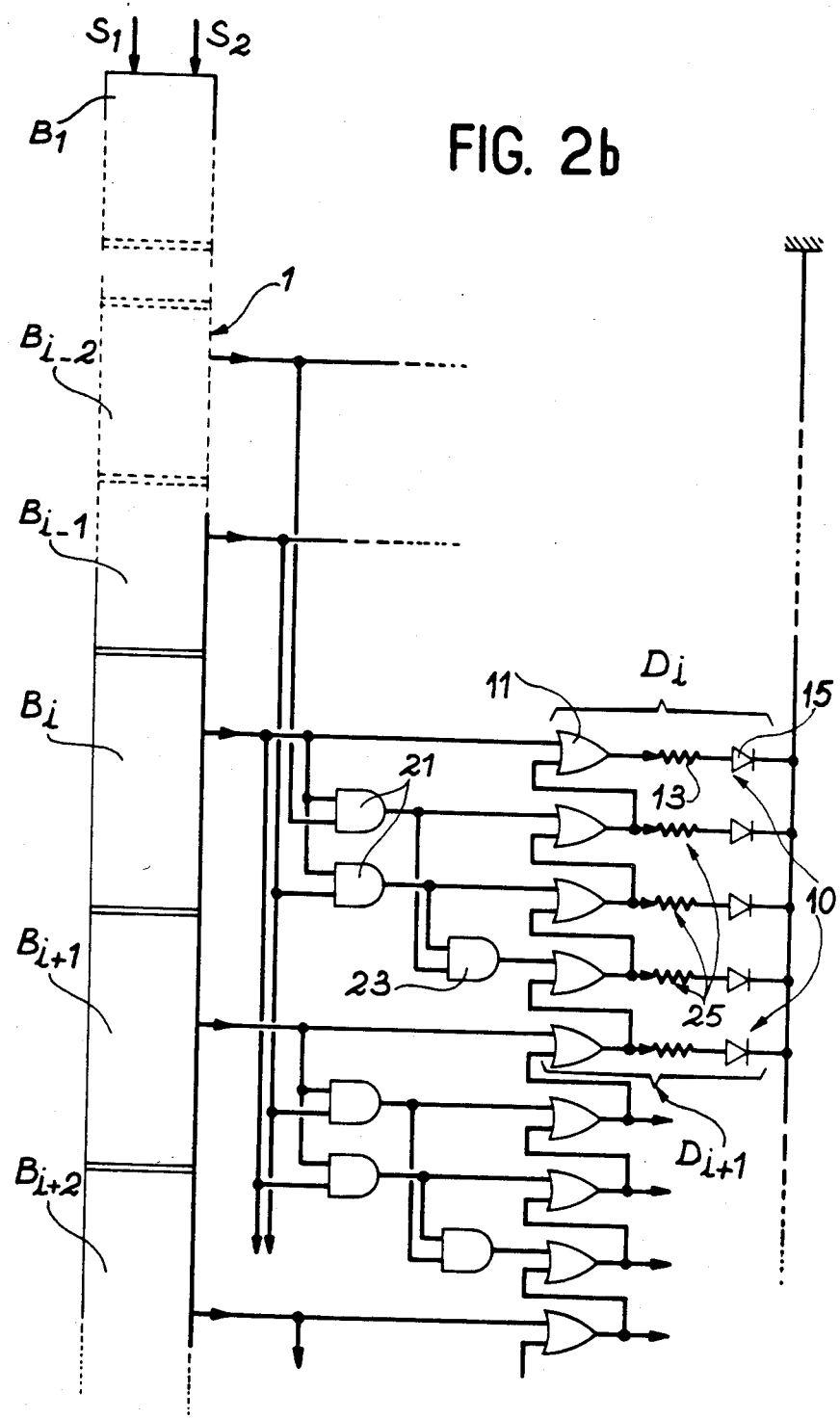

FIG. 2b shows display means making it possible to improve the accuracy of the analog display of the logarithm to base two of the content of the register 1 with n bistables. To obtain an accuracy of $1/(2^2)$ on the display, $2^p-1$ intermediate display means 25 with i and p being integers such that $1 \leq i \leq n$ and $p \geq 1$ are used between a display means $D_i$ associated with bistable $B_i$ and a display means $D_{i+1}$ associated with bistable $B_{i+1}$.

Thus, p intermediate display means are respectively connected via a logic AND gate 21 on the one hand to one of the p just lower order bistables $B_{i-1}$, $B_{i-2}$, ... $B_{i-p}$ and on the other hand to bistable $B_i$. Each of the other intermediate display means is separately connected via a logic AND gate 23 to the outputs of the logic AND gates 21 of two of the intermediate display means, the $2^p-1$ intermediate display means being arranged in the order of highest to lowest significance. It is obvious that an accuracy of $1/(2^p)$ can only be applied as from bistable $B_{p+1}$.

In the example of the drawing is shown an apparatus with three intermediate display means 25 making it possible to evaluate the logarithm to within $\frac{1}{4}$ (p=2). Thus, between bistable $B_i$ and bistable $B_{i+1}$, said three intermediate display means are connected, respectively in the order from the lowest to the highest significance, to bistable $B_i$ and to bistable $B_{i-2}$ via a logic AND gate 21, to bistable $B_1$ and bistable $B_{i-1}$ via a second logic AND gate 21 and finally to the outputs of the two logic AND gates 21 via a third logic AND gate 23, which makes it possible to successively display $B_i$, $B_i+B_{i-2}$, $B_i+B_{i-1}$, $B_i+B_{i-1}+B_{i-2}$.

The examples of application of a binary register with n bistables used according to the invention are numerous, those described hereinbefore being of a non-limitative nature, any other example of use using such a register falling within the scope of the invention.

What is claimed is:

1. A process for the use of a binary register with n interconnected bistable cells, wherein a first pulse signal $S_1$ of frequency $F_1$ is supplied to a counting input and a second pulse signal $S_2$ of frequency $F_2$ is supplied to a shift input, with $F_1 >> F_2$, the content of the register being permanently incremented by one unit for each pulse of the first signal $S_1$ and shifted so as to divide by two the content of the register for each pulse of the second signal $S_2$, the content of said register representing the ratio of the two frequencies.

2. A process for the use of a binary register with n bistable cells according to claim 1, wherein the content of the binary register with n bistable cells is loaded into a buffer register with n cells connected to said binary register for each pulse of the second signal $S_2$.

3. A process for the use of a binary register with n bistable cells according to claim 1, wherein a reference frequency signal and an unknown frequency signal is supplied to the input of the register with n bistable cells, the register content making it possible to determine the unknown frequency on the basis of the reference frequency.

4. A process for the use of a binary register with n bistable cells according to claim 1, wherein the logarithm to base two of the content of the binary register with n bistable cells is displayed via display means connected to the binary register, each activated bistable cell $B_i$ representing the number $2^{(i-1)}$ in decimal notation, with i being an integer such that $1 \leq i \leq n$.

5. A process for the use of a binary register with n bistable cells according to claim 1 for the detection of the passage of said ratio to a given value, wherein the detection pulse corresponds to the activation of the bistable cell materializing said value.

6. An apparatus for performing a use process of a binary register with n bistable cells according to claim 1, wherein it comprises a binary register with n bistable cells and display means for displaying the logarithm to base two of the register content, said means being connected on the one hand to the outputs of the binary register and on the other to a voltage level common to all said means, each display means comprising a logic OR gate connected by the output to a display cell, the output of a logic OR gate of a display means also being connected to the input of the logic OR gate of a lower order display means.

7. An apparatus according to claim 6, wherein the display cell is a photoemissive diode.

8. An apparatus according to claim 6, wherein the display cell is a liquid crystal cell.

9. An apparatus according to claim 6, wherein each display means is connected to a single cell at the same time.

10. An apparatus according to claim 6, wherein the display means comprise $2^p-1$ intermediate display means making it possible to have an accuracy of $1/(2^p)$ on the display, said intermediate display means being placed between a display means associated with a bistable cell $B_i$ and a display means associated with a bistable cell $B_{i+1}$, with i and p being integers such that $1 \leq i \leq n$ and $p \geq 1$, the intermediate display means controlled by logic devices producing the sums of the contents of the bistable cells $B_i, B_{i-1}, \ldots, B_{i-p}$.

11. An apparatus according to claim 6, wherein it also comprises a buffer register with n, each cell being connected to the output of a single bistable cell of the binary register.

* * * * *